United States Patent
Koo

(10) Patent No.: US 10,732,201 B2
(45) Date of Patent: Aug. 4, 2020

(54) TEST PROBE AND METHOD OF MANUFACTURING A TEST PROBE

(71) Applicant: Infineon Technologies AG, Neubiberg (DE)

(72) Inventor: Kok Kiat Koo, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 747 days.

(21) Appl. No.: 14/251,610

(22) Filed: Apr. 13, 2014

(65) Prior Publication Data

US 2015/0293149 A1    Oct. 15, 2015

(51) Int. Cl.
*G01R 1/067* (2006.01)

(52) U.S. Cl.
CPC ..... *G01R 1/06744* (2013.01); *G01R 1/06738* (2013.01)

(58) Field of Classification Search
CPC ............ G01R 1/06733; G01R 1/06738; G01R 1/06744; G01R 1/06775

See application file for complete search history.

(56) References Cited

U.S. PATENT DOCUMENTS

| | | | |
|---|---|---|---|
| 6,727,720 B2 | 4/2004 | Houge | |
| 7,927,109 B1* | 4/2011 | Gattuso | H01R 13/052 439/66 |
| 8,206,674 B2* | 6/2012 | Smith | B82Y 30/00 204/157.4 |
| 8,272,124 B2 | 9/2012 | Fang et al. | |
| 2006/0233694 A1* | 10/2006 | Sandhu | B82Y 10/00 423/447.3 |
| 2007/0051887 A1 | 3/2007 | Hidaka | |
| 2007/0267735 A1* | 11/2007 | Awano | H01L 21/6835 257/692 |
| 2008/0026564 A1* | 1/2008 | Frohberg | H01L 21/76804 438/637 |
| 2008/0036479 A1* | 2/2008 | Okumura | G01R 1/06738 324/755.01 |
| 2008/0070002 A1* | 3/2008 | Majidi | C09J 9/00 428/141 |
| 2008/0211101 A1* | 9/2008 | Han | B82Y 10/00 257/752 |
| 2009/0066352 A1* | 3/2009 | Gritters | B82Y 10/00 324/755.05 |
| 2009/0121732 A1* | 5/2009 | Crafts | G01R 1/073 324/756.03 |
| 2010/0083489 A1 | 4/2010 | Eldridge et al. | |
| 2012/0199280 A1* | 8/2012 | Brandorff | B82Y 30/00 156/247 |
| 2013/0220534 A1* | 8/2013 | Wei | B81C 1/0015 156/250 |
| 2014/0080303 A1* | 3/2014 | Sandhu | B82Y 10/00 438/667 |
| 2016/0086889 A1* | 3/2016 | Katagiri | H01L 23/53276 257/746 |

FOREIGN PATENT DOCUMENTS

| | | |
|---|---|---|
| CN | 103257254 A | 8/2013 |
| JP | 2010002391 A | 1/2010 |
| KR | 101265775 B1 | 5/2013 |

* cited by examiner

*Primary Examiner* — Son T Le
*Assistant Examiner* — Adam S Clarke

(57) ABSTRACT

A test probe for testing a chip package is provided, wherein the test probe comprises a test probe body comprising a conductive material; and a probe tip arranged on an end of the test probe body and comprising carbon nano tubes.

11 Claims, 2 Drawing Sheets

TEST PROBE AND METHOD OF MANUFACTURING A TEST PROBE

TECHNICAL FIELD

Various embodiments relate to test probes and methods of manufacturing a test probe.

BACKGROUND

Typical modern circuit boards or IC-packages tend to include a variety of components. For example, most circuit boards or IC-packages may include one or more integrated circuits with a set of leads, legs, pads, or pins on both sides of a package. There are also many rounded or irregularly shaped devices such as ceramic resistors, capacitors, and through-hole pins. IC-package components such as those described above often need to be monitored or tested by testing instruments such as oscilloscopes and other measuring, monitoring, diagnostic, and signal processing instruments.

In general, test probes are used for the testing test in order to provide an electrical connection between IC-package components and testing instruments. With the progress and development of the technology the integrated circuits are reduced in size leading to a finer pitch between neighboring leads or pins of the IC-package. To still enable the testing of the IC-package the test probes are reduced in size, i.e. the test probe tip is shrunk in size.

A typical test probe known in the art is shown in FIG. 2. In particular, FIG. 2 shows a test probe 200 comprising a cylindrical probe body 201 and a probe tip 202 integrally formed with the probe body. The probe tip comprises a tapered or peaked tip end so that a size of an area contacting leads or pins of an IC-package to be tested is reduced. The tip end acts as a current conducting path to leads or pads of the IC-package. However, in case of high currents, e.g. when power packages or power modules are tested, the small size of the tip end of the test probe may lead to a melting of the test probe tip.

SUMMARY

Thus, there may be a need for providing a probe tip and a method of manufacturing the same, wherein the probe tip has a high conductivity and/or a high temperature stability.

Various embodiments provide a test probe for testing a chip package, wherein the test probe comprises a test probe body comprising a conductive material; and a probe tip arranged on an end of the test probe body and comprising carbon nano tubes.

Furthermore, various embodiments provide a test probe for testing a chip-package, wherein the test probe comprises a test probe body; and a probe tip comprising a bundle of carbon nano tubes.

Moreover, various embodiments provide a method of manufacturing a test probe, wherein the method comprises providing a test probe body comprising a conductive material; and arranging a plurality of carbon nano tubes at an end of the test probe body.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DETAILED DESCRIPTION

Figure 1A:
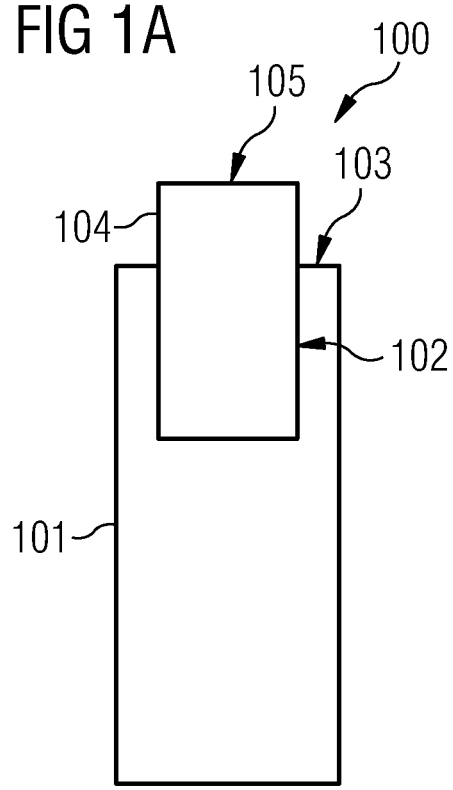
FIGS. 1A to 1F show cross-sectional views of test probes according to exemplary embodiments.

In the following further exemplary embodiments of a test probe and a method of manufacturing a test probe will be explained. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide a test probe for testing a chip or IC-package wherein the test probe comprises a test probe body and a probe tip comprising or consisting of a high density bundle or forest of multi-walled carbon nano tubes (MWCNTs). In particular, the carbon nano tubes may form a vertically aligned carbon nanotube high density bundle or forest.

In particular, the probe tip may comprise carbon nano tubes (CNTs) or consist of carbon nano tubes, e.g. a high density bundle or forest of CNTs. For example, the CNTs may be arranged at an end, e.g. an end face, of the test probe body. The test probe body may be a cylindrical test probe body. The term "cylindrical" should be interpreted in a broad sense, i.e. not restricted to a body having a circular or elliptical base area but also encompass cylinders comprising a rectangular, polygonal, or even irregular formed base area. The test probe body may comprise or may have a longitudinal axis. It should be noted that the conductive material may be a thermally conductive and/or electrically conductive material.

According to this application, the term "thermally conductive material" may particularly denote a material having a thermal conductivity above a given threshold, wherein the threshold may depend on the application. For example, the given threshold may be 100 W/(m·K), particularly 200 W/(m·K), more particularly 250 W/(m·K), even more particularly 300 W/(m·K) (corresponding e.g. to typical copper alloys), or even 500 W/(m·K).

According to this application, the term "electrically conductive material" may particularly denote a material having an electric conductivity above a given threshold, wherein the threshold may depend on the application. For example, the given threshold may be $1 \cdot 10^6$ S/m, particularly $5 \cdot 10^6$ S/m, more particularly $10 \cdot 10^6$ S/m, even more particularly $20 \cdot 10^6$ S/m, or even $50 \cdot 10^6$ S/m. For example, a suitable range for electrical conductivity may be i between $6 \cdot 10^6$ S/m (corresponding to steel) and $59 \cdot 10^6$ S/m (corresponding to copper).

Optionally, a coating may be formed on the test probe, e.g. on the test probe body. However, since carbon nano tubes have a suitable flexibility or compliancy the coating at least on the probe tip may be omitted.

The term "high density" or "forest" may particular denote that a number of carbon nano tubes per area is above a predetermined threshold. Examples for such a predetermined threshold may be determined by a person skilled in the art depending of the intended application of the test probe. Depending on the application or field suitable density values may be in the range of thousand CNTs per square millimeter to $10^{10}$ CNTs per square millimeter or even higher or may be a total number of $10^5$ to $10^{10}$ CNTs.

By providing a probe tip comprising or consisting of CNTs it may be possible to provide a test probe potentially resisting high currents while providing a small contact area. That is, CNTs may be a suitable material for contact tips of a test probe when a high current load or high current density shall be transmitted to or from the package to a testing equipment or test circuit. Typical examples of current loads or current densities to be transmitted by the test probe may be in the range of 1 A to about 60 A or even to about 150 A or even higher. It should be mentioned that these loads may correspond to pulsed mode loads, i.e. not to a constant load. For example the load may be 60 A for 1 ms or 30 A for 5 ms or so on.

At the same time the use of CNT may (compared to common metal tips) increase the lifespan of the test probe tip and thus of the lifespan of the whole test probe due to the high flexibility or compliancy of CNT, and thus a lower wear, when compared to common metals. It may as well enable the use of small pitches due to a high electrical and/or thermal conductivity of CNTs compared to common metals. In particular, the CNTs may act or may provide a current conducting path to leads or pads of an IC-package. Such CNTs may have, particularly along longitudinal axes of the CNTs, a higher electrical and thermal conductivity than typical metals used today.

According to an exemplary embodiment of the test probe the carbon nano tubes are multi-walled carbon nano tubes.

According to an exemplary embodiment of the test probe the conductive material is metal.

In particular, the test probe body may be a massive or hollow metal body. For example, the probe body may comprise or may consist of a single metal, e.g. copper, aluminum beryllium copper, palladium cobalt, steel alloys, or another metal having high electrical conductivity and/or thermal conductivity, or a metal alloy or a metal non-metal mixture. Alternatively to a massive metal body the conductive material may be arranged in the test probe as a cable, conductor or lead and may be surrounded or enclosed by a non-conducting or insulating material. It should be mentioned that the probe body may be coated or not.

According to an exemplary embodiment of the test probe the probe body comprises a recess into which the probe tip is at least partially inserted.

The respective technique may be similar to the so called damascene technique, i.e. the probe tip may form a kind of inlay to the probe body. However, advantageously some portions or parts of the probe tip are protruding or projecting above the end of the test probe body. These protruding or projecting portions may form the areas or regions which are contacted to the IC-package during use of the test probe for testing the IC-package.

According to an exemplary embodiment of the test probe the probe tip comprises a tip end with a form out of the group consisting of: a peaked tip end; a spherical shell tip end; a circular tip end; an undulated tip end; and a planar tip end.

According to an exemplary embodiment of the test probe the probe tip is adhered to the probe body.

In particular, a (electrically and/or thermally) conductive adhesive, metal, or glue may be used. Examples of possible adhesives may include high temperature solder materials or high temperature conductive adhesives.

According to an exemplary embodiment of the test probe the carbon nano tubes are aligned with respect to each other.

In particular, the carbon nano tubes may form a forest or a bundle of carbon nano tubes. A longitudinal axis of the carbon nano tubes may be aligned parallel or substantially parallel to a longitudinal axis of the test probe body.

According to an exemplary embodiment of the test probe the test probe comprises a plurality of probe tips each comprising carbon nano tubes.

According to an exemplary embodiment of the method the arranging comprising an adhering of the plurality of carbon nano tubes to the test probe body.

According to an exemplary embodiment of the method the arranging comprises growing of the carbon nano tubes on the test probe body.

Thus, the arranging of the CNTs may be performed by an adhering or fixing of grown CNTs to the test probe body or may be performed by directly growing the CNTs on the test probe body or a combination of these two methods. In case of a growing of the CNT on the test probe body a suitable seed layer may be arranged on the test probe body in advance.

According to an exemplary embodiment the method further comprises forming a recess into the end of the test probe body, wherein the plurality of carbon nano tubes is arranged in the recess.

The following detailed description refers to the accompanying drawings that show, by way of illustration, specific details and embodiments in which the invention may be practiced.

FIG. 1A to FIG. 1F show cross-sectional views of test probes according to exemplary embodiments. Typical sizes of the depicted test probes may be in the range of 0.1 mm to 1.0 mm, more particularly from 0.3 mm to 0.5 mm, in diameter and 1 mm to 10 mm, more particularly from 3 mm to 5 mm high in length.

In particular, FIG. 1A shows a cross sectional view of a test probe 100 comprising a test proby body 101 of metal, e.g. copper. In the metal body 101 a recess 102 is formed at one end face 103 of the same. A plurality of CNTs are arranged in the recess. In particular, the CNTs, e.g. multi wall CNTs (MWCNTs), may be arranged in form of a forest or bundle of CNTs having a substantially parallel or parallel orientation with respect to each other. The CNts form a probe tip 104 of the test probe 100 and provide a conductive path between the test probe body and electric circuits connected thereto a package (in particular leads or pads thereof) which is contacted by the test probe. According to the embodiment of FIG. 1A a free end or contact end 105 of the probe tip is flat or plane. In particular, the MWCNTs may form a high density MWCNT forest or bundle tip providing a conductive path providing a high durability or stability with respect to high currents and (mechanical) wear. The test probe body and/or the probe tip may have any suitable form or shape, e.g. cylindrical, cuboid, conical or the like.

Figure 1B:
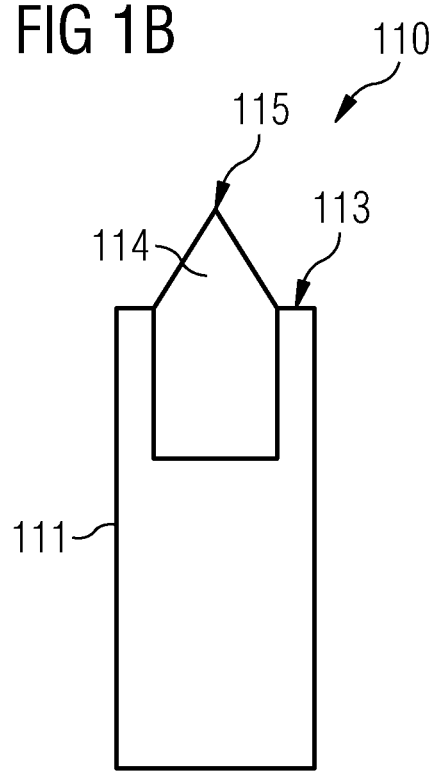

In particular, FIG. 1B shows a cross-sectional view of another test probe 110 which differs from the one shown in FIG. 1A in that a contacting end or free end 105 of the probe tip 104 of FIG. 1A has a flat or planar surface while a probe tip 114 of FIG. 1B arranged at an end face 113 of a test probe body 111 has a tapered or peaked surface 115. That is, the embodiment of FIG. 1B shows a peaked probe tip formed by a forest or bundle of MWCNTs and providing a small contact area.

Figure 1C:
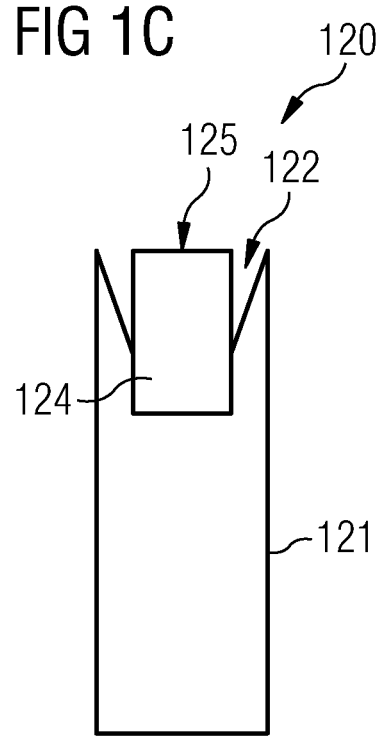

In particular, FIG. 1C shows a cross-sectional view of another test probe 120 which differs from the one shown in FIGS. 1A and 1B in that a test probe body 121 comprises a recess 122 having tapered or oblique side walls while an attached (or directly grown) probe tip 124 (comprising a plurality of CNTs) still have straight side walls. Thus, the resulting test probe may have, even after arranging of the plurality of CNTs, a recess formed therein. A free end 125 of the CNTs may be a flat end as shown in FIG. 1C or may be a tapered or peaked one as shown in FIG. 1B.

Figure 1D:
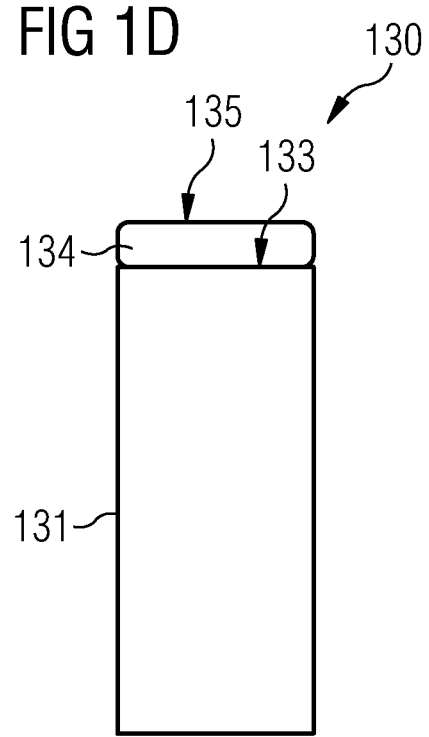

In particular, FIG. 1D shows a cross-sectional view of another test probe 130 which differs from the one shown in FIGS. 1A to 1C in that a test probe body 131 has a flat end face 133, i.e. no recess is formed therein, and a probe tip 134 comprising or consisting of a plurality of CNTs, is formed on that flat end face 133. A free end 135 of the CNTs may be a flat end as shown in FIG. 1D or may be a tapered or peaked one as shown in FIG. 1B.

Figure 1E:
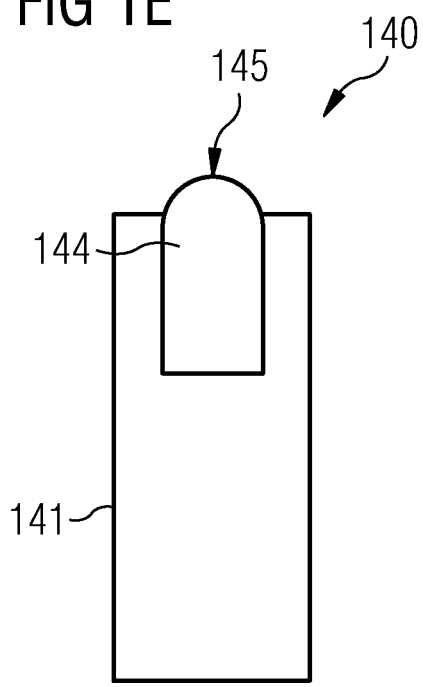

In particular, FIG. 1E shows a cross-sectional view of another test probe 140 which is similar to the one shown in FIGS. 1A and 1B but differs from these embodiments by the fact that a free or contact end 145 of a probe tip 144 (formed by the MWCNTs) has a spherical shell form and is arranged in a recess of a test probe body 141.

Figure 1F:
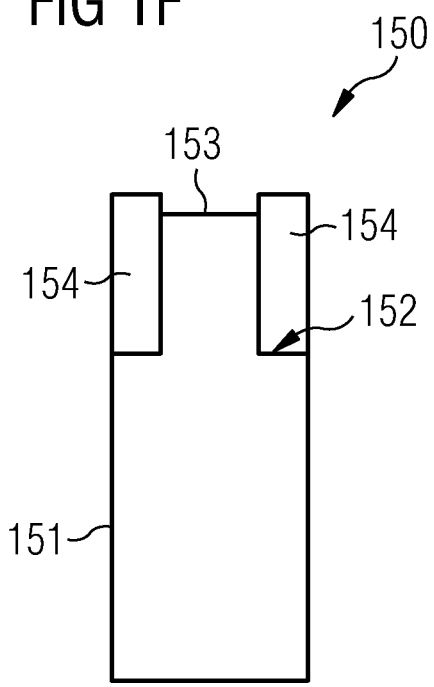
Figure 2:
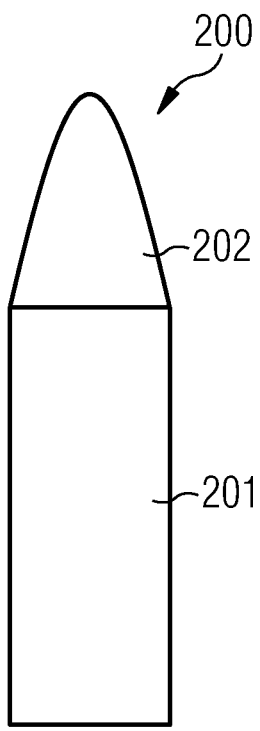
FIG. 2 schematically shows a common test probe.

In particular, FIG. 1F shows a cross-sectional view of another test probe 150. According to the embodiment of FIG. 1F not a single recess is formed in or at an end face 153 of a test probe body 151 but a peripheral grade or step 152 is formed at an perimeter of the end face 153. In or at this step a plurality of MWCNTs is arranged which form a probe tip 154 of the test probe 150.

Many other embodiments of the test probe are possible depending on the application for which the test probe shall be used. For example, the test probe may comprise a plurality, e.g. two, three, four or even more, of different or separate probe tips arranged at an end face of a test probe body. Furthermore, a contact or free end of the respective probe tips may have different forms as already indicated in FIG. 1A to 1F. For example, a crown like structure, i.e. several peaks for a single probe tip, or an undulated shape for the free end of the probe tip may be possible as well.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A test probe for testing a chip package, the test probe comprising:
   a test probe body comprising a conductive material; and
   a probe tip arranged on an end of the test probe body and comprising carbon nano tubes,
   wherein the test probe body comprises a recess into which the probe tip is at least partially inserted,
   wherein the recess has a first region with one of tapered and oblique side walls, while a second, bottom region of the recess has straight side walls;
   wherein in a cross-sectional view, the tapered or oblique side walls define an increasing diameter of the recess;
   wherein the increasing diameter increases in a direction from the second region to the first region; and
   wherein the probe tip has straight side walls being laterally distant from a portion of the tapered or oblique side walls of the recess, thus the test probe, with the probe tip arranged in the recess, has formed therein a gap between the straight side walls of the probe tip and the tapered or oblique side walls of the recess.

2. The test probe according to claim 1, wherein the carbon nano tubes are multi-walled carbon nano tubes.

3. The test probe according to claim 1, wherein the conductive material is metal.

4. The test probe according to claim 1, wherein the probe tip comprises a tip end with a form out of the group consisting of:
   a peaked tip end;
   a spherical shell tip end;
   a circular tip end; and
   an undulated tip end.

5. The test probe according to claim 1, wherein the probe tip is adhered to the probe body.

6. The test probe according to claim 1, wherein the carbon nano tubes are aligned with respect to each other.

7. The test probe according to claim 1, wherein the test probe comprises a plurality of probe tips each comprising carbon nano tubes.

8. The test probe according to claim 1, wherein the probe tip comprises a tip end with a form of a planar tip end.

9. A method of manufacturing a test probe, the method comprising:
   providing a test probe body comprising a conductive material; and
   arranging a plurality of carbon nano tubes at an end of the test probe body,
   forming a recess into the end of the test probe body, wherein the plurality of carbon nano tubes is arranged in the recess,
   wherein the recess is formed with a first region with one of tapered and oblique side walls, while a bottom region of the recess has straight side walls;
   wherein in a cross-sectional view, the tapered or oblique side walls define an increasing diameter of the recess;
   wherein the increasing diameter increases in a direction from the second region to the first region; and
   wherein the probe tip has straight side walls being laterally distant from a portion of the tapered or oblique side walls of the recess, thus the test probe, with the probe tip arranged in the recess, has formed therein a gap between the straight side walls of the probe tip and the tapered or oblique side walls of the recess.

10. The method according to claim 9, wherein the arranging comprising an adhering of the plurality of carbon nano tubes to the test probe body.

11. The method according to claim 9, wherein the arranging comprises growing of the carbon nano tubes on the test probe body.

* * * * *